(12) United States Patent
Beck

(10) Patent No.: US 8,816,795 B2
(45) Date of Patent: Aug. 26, 2014

(54) EMC FILTER CIRCUIT

(71) Applicant: Schaffner EMV AG, Luterbach (CH)

(72) Inventor: Fabian Beck, Ruttenen (CH)

(73) Assignee: Schaffner EMV AG, Luterbach (CH)

( * ) Notice: Subject to any disclaimer, the term of this patent is extended or adjusted under 35 U.S.C. 154(b) by 0 days.

(21) Appl. No.: 13/862,127

(22) Filed: Apr. 12, 2013

(65) Prior Publication Data

US 2013/0222078 A1 Aug. 29, 2013

Related U.S. Application Data

(63) Continuation of application No. PCT/EP2010/066855, filed on Nov. 5, 2010.

(51) Int. Cl.
*H03H 7/01* (2006.01)
*H03H 1/00* (2006.01)

(52) U.S. Cl.
CPC ....... *H03H 7/0138* (2013.01); *H03H 2001/005* (2013.01); *H03H 2001/0042* (2013.01); *H03H 1/0007* (2013.01)
USPC ........................................... 333/181; 333/12

(58) Field of Classification Search
CPC ... H03H 1/0007; H03H 7/427; H03H 7/0115; H03H 7/0138; H03H 2001/0042; H03H 2001/005
USPC ................................... 333/12, 181
See application file for complete search history.

(56) References Cited

U.S. PATENT DOCUMENTS

| | | | | |
|---|---|---|---|---|
| 4,672,337 A | * | 6/1987 | Thibeault | 333/167 |
| 4,950,185 A | | 8/1990 | Boutros | |
| 5,213,522 A | * | 5/1993 | Kojima | 439/620.07 |
| 5,580,280 A | * | 12/1996 | Minich et al. | 439/620.22 |
| 6,940,366 B2 | * | 9/2005 | Komiya | 333/181 |
| 2006/0274472 A1 | * | 12/2006 | Saito et al. | 361/118 |
| 2008/0197947 A1 | * | 8/2008 | Gevorgyan et al. | 334/15 |

FOREIGN PATENT DOCUMENTS

| | | |
|---|---|---|
| DE | 873110 C | 4/1953 |
| DE | 4025159 A1 | 2/1992 |
| DE | 4218171 A1 | 12/1993 |
| DE | 10240084 A1 | 3/2004 |
| JP | 2207470 A | 8/1990 |

* cited by examiner

*Primary Examiner* — Benny Lee
*Assistant Examiner* — Rakesh Patel
(74) *Attorney, Agent, or Firm* — Blank Rome LLP

(57) ABSTRACT

An EMC filter circuit (1) has an essentially rigid busbar (3) for carrying an electric power to which is superposed a noise component in a conductive housing (2), which connected to ground. The filter (1) has two main elements inductors (4) increasing an impedance of the bus bar and capacitors (5) connected between the busbar (3) and the conductive housing (2). The capacitors (5) are inserted and tightly held solderless in position between the conductive housing (2) and the electric conductor (3). One advantage comes from the fact, that flat connection elements are arranged on both sides of the capacitors (5), which allow an easy manufacturing process.

11 Claims, 2 Drawing Sheets

EMC FILTER CIRCUIT

RELATED APPLICATION

This application is a continuation of PCT/EP/066855, the contents of which are hereby incorporated by reference.

FIELD OF THE INVENTION

Embodiments of the present invention relate to an EMC filter, in particular to a high-current EMC filter.

DESCRIPTION OF RELATED ART

Feed-through components such as feed-through filters or feed-through capacitors are electrical components, which are provided in an electric power line. Feed-through components comprise an electric circuit arranged around a conductor in a housing. The conductor sticks out of the housing for creating two outer contacts for connecting external elements. The elements of the electrical circuit consist of capacitors, ferromagnetic materials or resistances which are in many embodiments co-axially arranged with the electric conductor.

Feed-through components are used generally for changing the transmitting properties of electric power or data lines. Such filters, with for example a π-filter circuit, are mainly in power lines for reduction of wide band noise which is sensitive to noise generating devices. Such filter circuits consist mostly of one or two identical capacitive members and one ferromagnetic member. Until now the concentric arrangement of the elements of the circuit increases high frequency damping values. However, depending on the arrangement, the insertion losses of the filter could be rather high. Such feed-through components are known from DE4218171, DE10240084 or DE4025159.

Furthermore, most of the feed-through elements are soldered or pressed with a conductive gasket to contact the different elements of circuit with each other.

BRIEF SUMMARY OF THE INVENTION

It is one aim of the present invention to provide an EMC filter, which will be more reliable and easier to assemble.

It is another aim of the present invention to create an EMC filter operable within a high frequency bandwidth.

According to the invention, these aims are achieved by means of an EMC filter according to the independent claims. The dependent claims show further advantageous embodiments.

Especially these aims are solved by an EMC filter unit, wherein the capacitor has a first face and a second face in opposition, each one of which comprises an electric terminal, wherein the faces are flat and parallel, and the capacitor is inserted and tightly held in position between the conductive housing and the electric conductor so as to create an electric contact between housing and conductor and the corresponding terminal of the capacitor.

One advantage comes from the fact that flat faces on opposite sides of the capacitors, which allows for easy manufacturing without soldering. The invention can also be used for 2-, 3- or 4-line-EMC filters.

BRIEF DESCRIPTION OF THE DRAWINGS

The invention will be better understood with the aid of the description of an embodiment given by way of example and illustrated by the figures, in which.

DETAILED DESCRIPTION OF THE INVENTION

Figure 1A:
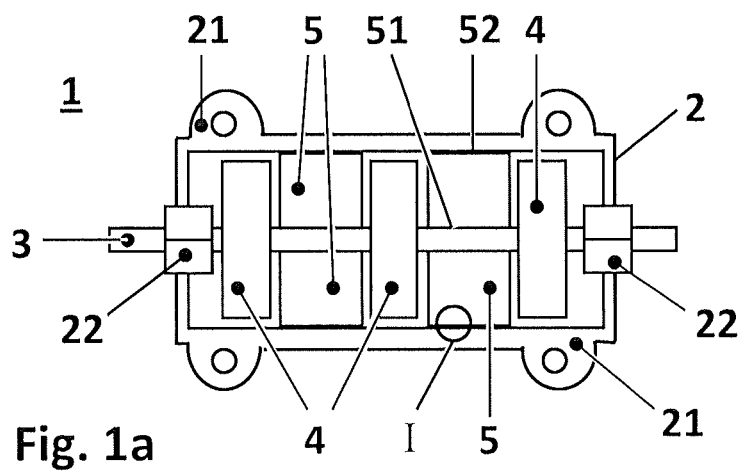
FIG. 1a shows a schematic view of a first embodiment of an EMC filter.
Figure 1B:
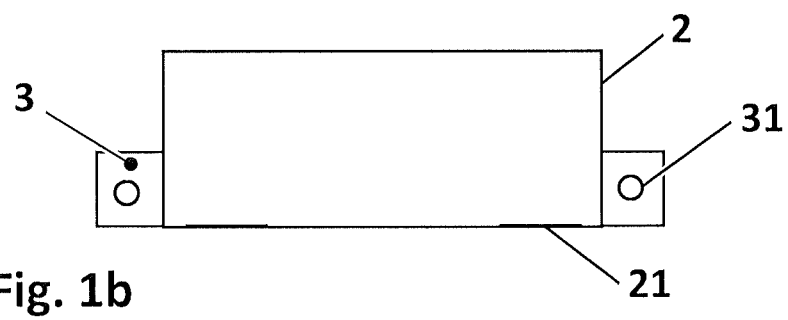
FIG. 1b shows a side view of the EMC filter.

FIG. 1a shows a schematic view of a first embodiment of an EMC filter circuit 1 and FIG. 1b shows a side view of the EMC filter circuit 1. The EMC filter circuit 1 comprises a conductive housing 2, which is grounded with connection elements (not shown), and a rigid busbar 3 for carrying electric power on which a noise component is superposed. Such an EMC filter circuit 1 is mainly used in power lines for reduction of wide band noise which is sensitive to noise generating devices. As seen in FIG. 1a, the busbar 3 is arranged in the middle of the housing 2 and the busbar 3 projects to outside of the housing 2 are opposite ends of the housing 2. In order to hold the busbar 3 in position, and to isolate it from the housing 2 at opposite ends of the housing 2, an isolating material 22 is used. The isolating material 22 could be for example plastic.

As seen in FIG. 1b apertures 31 are arranged on both ends of the busbar 3 for connection of the busbar 3 to external devices via a terminal (not shown) or to other means. The housing 2 will be closed in the lower side by a cover (not shown) and has at least one lateral means 21 for fixing the housing 2 to any external device; in this example the lateral means 21 for fixing the housing 2 are eyelets 21, each with an aperture, and which are provided at each side of the housing 2. Advantageously the housing 2 is electrically conductive metal, e.g. aluminum.

The EMC filter circuit 1 comprises three main inductors 4 and four capacitors 5. The inductors 4 are arranged around the busbar 3 and consist of a ferromagnetic material such as ferrite with a gap, iron powder, sendust or similar. In one embodiment they have a rectangular shape with a central rectangular aperture which accommodates the busbar 3. The inductors 4 increase impedance of the central busbar 3. The number of inductors 4 is given by the way of example and will be chosen according to the use of the EMC filter circuit 1.

Figure 1C:
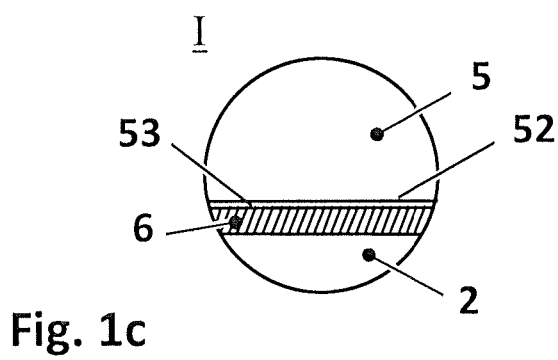
FIG. 1c shows the detail I of FIG. 1a, which illustrates a conductive gasket between the housing and the capacitor.

Furthermore, the capacitors 5 have each a first face 51 and a second face 52 which is opposite to the first face 51. Each of the first face 51 and the second face 52 comprise an electric terminal. The capacitors 5 are inserted into the housing 2 solderless (i.e. are not soldered), and are tightly held in position between the conductive housing 2 and the busbar 3. The first face 51 is thereby juxtaposed to the busbar 3, and the corresponding electric terminal on the first face 51 is in electric contact with the busbar 3. The second face 52 is juxtaposed to the conductive housing 2, and the electric terminal on the second face 52 is in electric contact with the conductive housing 2. Therefore the first and second faces 51, 52 are in direct electrical contact with the busbar 3 and the grounded conductive housing 2. To increase the contact, the first and second faces 51, 52 can each be provided with a conductive electrical layer 53. As seen in FIG. 1c, an electrical gasket or mesh 6 is provided between the electric terminal of each face 51 and 52 and the surface of the conductive housing 2 and of the busbar 3, respectively. However, it would also be possible to have only one or none of both measures, i.e. either the conductive electrical layer 53 or the mesh 6 or none of them. The number of capacitors 5 is four; four capacitors 5 is given by the way of example only and the number of capacitors 5 which are provided canvary according to the use of the EMC filter circuit 1. The capacity of the capacitors 5 will, in an advantageous embodiment, be identical. In order to achieve a good contact to the housing 2 and busbar 3, said first and second faces 51 52 of each capacitor 5 are advantageously flat and parallel, and the capacitors 5 have a rounded or a rectangular shape. This guarantees a simple assembly of the capacitors 5 in the housing 2. The EMC filter circuit 1 is a filter with a double π-circuit. In another embodiment, it could be still a T-circuit or L-circuit to be constructed.

One advantage is that the construction of the EMC filter circuit 1 is much simpler than known constructions of prior art filters. Another advantage is that this design, and especially the flat electric terminals on both the first and second faces 51, 52 of the capacitors 5 which allow for an easier manufacturing process. The inductors 4 can be placed on the busbar 3 and assembled into the housing 2, being held in position with the isolating material 22. Finally, the capacitors 5 can be put manually into place. Then the housing 2 will be closed and fixed using the eyelets 21 or soldering pins on a device. Another advantage comes from the fact that no electrical contact needs to be soldered inside the EMC filter circuit 1. Due to short connection of the capacitors 5 between bus bar 3 and housing 2, the EMC filter circuit 1 works with a high frequency bandwidth.

Figure 2:
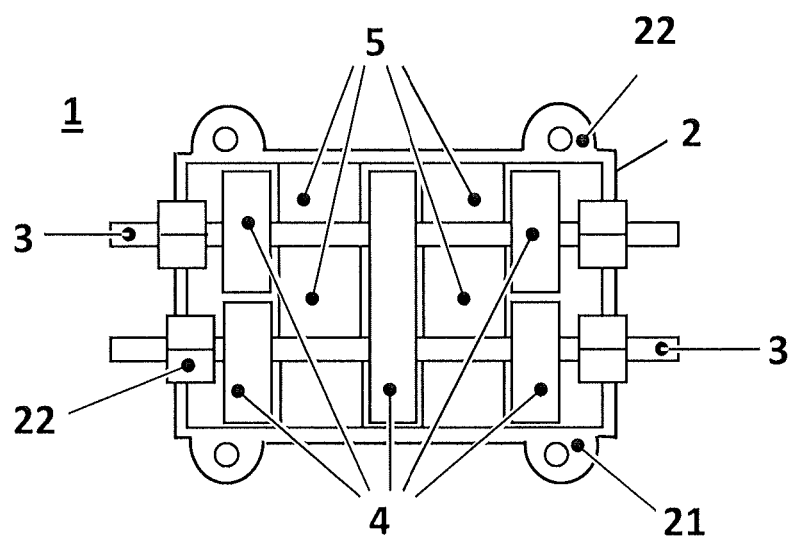
FIG. 2 shows a schematic view of a second embodiment of an EMC filter.

FIG. 2 shows s schematic view of a second embodiment of an EMC filter circuit 1 with two parallel busbars 3 in a housing 2, where capacitors 5 are inserted between one bus bar 3 and the housing 2 in the same way as described as for FIG. 1. Furthermore, one or more capacitors 5 can be inserted and tightly held in position between the parallel busbars 3. These capacitors 5 have again a first face 51 which is opposite to the first face 52. Each of the first face and the second face 51, 52 comprises an electric terminal. The first and second faces of each of the capacitors 5 are flat and parallel. The use of a conductive gasket or an electric conductive film between the electric terminals of the capacitors and the electric conductor 3 and/or the housing 2, as described for FIG. 1 can be envisaged. In this embodiment, the inductors 4 can be mechanically independent and individually arranged around a busbar 3 (as shown for the inductors 4 on the left and right ends of the busbars 3), or can be built as common core through which both busbars 3 pass through (as shown for the inductor 4 provided at the centre of the busbars 3). Furthermore, the man skilled in the art will understand that this principle can be applied to EMC filters having three or four bus bars 3.

REFERENCE NUMBERS

1 EMC filter circuit
2 Conductive housing
21 Fixing means
22 Isolating material
3 Busbar
31 Aperture
4 Inductor
5 Capacitor
51 First face of capacitor 5
52 Second face of capacitor 5
53 Conductive electrical layer
6 Gasket, mesh

The invention claimed is:

1. An EMC filter circuit comprising:
an electric conductor for carrying electric power with a flat first side and a flat second side opposed to the first side, wherein the electric conductor is a rigid busbar;
a conductive housing, at least partially enclosing the electric conductor;
at least one magnetic element comprising a ferromagnetic material in proximity of the electric conductor and increasing an impedance of the electric conductor;
at least one capacitor electrically connected between the electric conductor and the conductive housing,
wherein the at least one capacitor has a first face and a second face opposed to the first face, wherein each of the first face and the second face comprises an electric terminal, wherein the first face and the second face are flat, and
the at least one capacitor is inserted and tightly held in position between the conductive housing and the electric conductor so as to create an electric contact between the conductive housing and the electric terminal of the second face of the at least one capacitor and so as to create an electric contact between the one of the two flat sides of the electric conductor and the electric terminal of the first face of the at least one capacitor;
a further electric conductor, wherein the further electric conductor is a further rigid busbar arranged in parallel to the rigid busbar; and
at least one further capacitor electrically connected between the electric conductor and the further electric conductor, wherein the at least one further capacitor has a first face and a second face opposed to the first face, wherein each of the first face and the second face of the at least one further capacitor comprises an electric terminal, wherein the first face and the second face are flat and parallel, and at least one further capacitor is inserted and tightly held in position between the electric conductor and the further electric conductor.

2. The EMC filter circuit of claim 1, wherein the first face and the second face of the at least one capacitor are parallel.

3. The EMC filter circuit of claim 1, wherein the at least one capacitor has a body with a round or rectangular shape between the parallel first face and the second face.

4. The EMC filter circuit of claim 1, wherein the electric terminals of the at least one capacitor are in direct physical contact with the electric conductor and the conductive housing, respectively.

5. The EMC filter circuit of claim 1, wherein a respective conductive gasket is interposed between the electric terminals of the at least one capacitor and the electric conductor and the conductive housing, respectively.

6. The EMC filter circuit of claim 1, wherein the electric terminals of the at least one capacitor are respectively provided with a conductive electrical layer.

7. The EMC filter circuit of claim 1, wherein the at least one capacitor is connected solderless to the conductive housing and the electric conductor, respectively.

8. The EMC filter circuit of claim 1, wherein the at least one magnetic element establishes a closed magnetic circuit around the electric conductor and the further electric conductor.

9. The EMC filter circuit of claim 1, wherein the EMC filter circuit is a single or multiple π-, T- or L-filter.

10. The EMC filter circuit of claim 1, wherein the at least one magnetic element establishes a closed magnetic circuit around the electric conductor.

11. An EMC filter circuit comprising:
an electric conductor for carrying an electric power with a flat first side and a flat second side opposed to the first side, wherein the electric conductor is a rigid busbar;
a conductive housing, at least partially enclosing the electric conductor;

at least one magnetic element comprising a ferromagnetic material in proximity of the electric conductor and increasing an impedance of the electric conductor;

a first capacitor and a second capacitor electrically connected between the electric conductor and the conductive housing, wherein;

the first capacitor has a first face and a second face opposed to the first face and the second capacitor has a first face and a second face opposed to the first face of the second capacitor, wherein each of the first face and the second face of the first capacitor and of the second capacitor comprises an electric terminal, wherein the first face and the second face of the first capacitor and of the second capacitor are flat, and wherein the first capacitor is inserted and tightly held in position between the conductive housing and the first side of the electric conductor so as to create an electric contact between the first side of the electric conductor and the electric terminal of the first face of the first capacitor and to create an electric contact between the conductive housing and the electric terminal of the second face of the first capacitor, wherein the second capacitor is inserted and tightly held in position between the conductive housing and the second side of the electric conductor.

* * * * *